United States Patent [19]
Isobe et al.

[11] Patent Number: 6,114,199
[45] Date of Patent: Sep. 5, 2000

[54] MANUFACTURING METHOD FOR FERROELECTRIC FILM AND NONVOLATILE MEMORY USING THE SAME

[75] Inventors: Chiharu Isobe, Tokyo; Masataka Sugiyama, Kanagawa; Katsuyuki Hironaka, Kanagawa; Takaaki Ami, Kanagawa; Christian Gutleben, Kanagawa, all of Japan

[73] Assignee: Sony Corporation, Tokyo, Japan

[21] Appl. No.: 08/704,288

[22] Filed: Aug. 28, 1996

[30] Foreign Application Priority Data

Aug. 30, 1995 [JP] Japan ................................. 7-245516

[51] Int. Cl.⁷ ............................................. H01L 21/8242
[52] U.S. Cl. ............................ 438/240; 438/3; 438/253; 438/396
[58] Field of Search ................................ 438/3, 240, 253, 438/254, 255, 396, 397, 398; 257/310, 295

[56] References Cited

U.S. PATENT DOCUMENTS

| | | | |
|---|---|---|---|
| 5,374,578 | 12/1994 | Patel et al. ........................... | 438/3 |
| 5,423,285 | 6/1995 | Paz De Araujo et al. ............ | 438/3 |
| 5,426,075 | 6/1995 | Perino et al. ......................... | 438/3 |
| 5,443,030 | 8/1995 | Ishihara et al. ....................... | 117/8 |
| 5,468,679 | 11/1995 | Paz De Araujo et al. ............ | 438/3 |
| 5,618,761 | 4/1997 | Eguchi et al. ......................... | 438/785 |
| 5,716,875 | 2/1998 | Jones, Jr. et al. ..................... | 438/3 |
| 5,728,603 | 3/1998 | Emesh et al. ......................... | 438/3 |

OTHER PUBLICATIONS

Ravichandran, D et al., "The Effect of Annealing Temperature on the Formation of SrBi/sub 2/Ta/sub 2/O/sub 9/(SBT) Thin Films", Ferroelectrics, 1996. ISAF '96., Proceedings of the Tenth IEEE International Symposium on Applications of.; vol. 2, pp. 601–603, Aug. 1996.

Muller, R. et al., "Phase Compatibilities in the Bi–Poor region of the System Bi–Sr–Ca–O at 820 and 900° C. in Air", Physica, C243, pp. 103–112, 1995.

*Primary Examiner*—Carl Whitehead, Jr.
*Assistant Examiner*—Toniae M. Thomas
*Attorney, Agent, or Firm*—Ronald P. Kananen; Rader, Fishman & Grauer

[57] ABSTRACT

A ferroelectric thin film is subjected to heat treatment in an active oxygen atmosphere containing an oxidizing gas such as ozone, $N_2O$, or $NO_2$, thereby preventing occurrence of oxygen defects (oxygen vacancies) in the thin film, and avoiding a deterioration in dielectric characteristics, ferroelectric characteristics, and electric characteristics required for the ferroelectric thin film, such as a reduction in permittivity, an increase in leakage current, a reduction in remanent polarization, and an increase in coercive electric field. Thus, the ferroelectric thin film having stable characteristics can be formed. Further, a nonvolatile memory cell using this ferroelectric thin film as a capacitor is formed.

14 Claims, 10 Drawing Sheets

MANUFACTURING METHOD FOR FERROELECTRIC FILM AND NONVOLATILE MEMORY USING THE SAME

BACKGROUND OF THE INVENTION

The present invention relates to a forming method for a ferroelectric thin film which can reduce oxygen defects in a dielectric, and also to a manufacturing method for a nonvolatile memory using the forming method for the ferroelectric thin film.

With the recent progress of film deposition techniques, research of applications of a nonvolatile memory cell using a ferroelectric thin film has increasingly been developed. This nonvolatile memory cell is a high-speed rewritable nonvolatile memory cell utilizing the high-speed polarization inversion and the residual polarization of the ferroelectric thin film. The nonvolatile memory cell using the ferroelectric thin film now being researched may be classified into a type of detecting a change in quantity of stored charge in a ferroelectric capacitor and a type of detecting a change in resistance due to spontaneous polarization of a ferroelectric. The nonvolatile memory cell in the present invention belongs to the former type.

An example of the nonvolatile memory cell of the type of detecting a change in quantity of stored charge in a ferroelectric capacitor is a nonvolatile memory cell having a 1-capacitor+1-transistor structure configured by adding a select transistor to a ferroelectric capacitor. The ferroelectric capacitor is composed of a lower electrode, an upper electrode, and a ferroelectric thin film sandwiched between these electrodes.

In regard to materials of the ferroelectric thin film, a related art PZT ferroelectric shows a so-called fatigue phenomenon, i.e., a reduction in residual polarization with repetitions of rewriting of data. However, this fatigue phenomenon is not exhibited in a Bi-based layer-structural perovskite type ferroelectric thin film (which will be referred to also as a bismuth layered ferroelectric thin film), so that this material has now received attention as the material for the nonvolatile memory. In applying the bismuth layered ferroelectric thin film to the nonvolatile memory, formation of this thin film is an especially important technique, and development has now been pursued on a spin-coat process such as a MOD process (Metal Organic Decomposition) process and a CVD (Chemical Vapor Deposition) process.

However, a ferroelectric thin film obtained by any of these processes lacks oxygen, and tends to be formed as a film containing oxygen defects (oxygen vacancies). The oxygen defects (oxygen vacancies) cause a reduction in permittivity, an increase in leakage current, a reduction in residual polarization, an increase in coercive electric field, etc., thus making a large trouble in obtaining desired dielectric characteristics and ferroelectric characteristics.

The occurrence of oxygen defects (oxygen vacancies) during formation of the ferroelectric thin film by the MOD process or the CVD process is considered to be due to the following. In the case of film deposition by the MOD process, a thin film is first deposited from source compounds having no metal-oxide bonds, and is next subjected to heat treatment in an oxygen atmosphere. As a result, metal-oxygen bonds based on solid-phase diffusion of oxygen are formed by this heat treatment to thereby form a ferroelectric thin film as an oxide. Accordingly, oxygen defects (oxygen vacancies) tend to be generated in the ferroelectric thin film formed by the MOD process. On the other hand, also in the case of film deposition by the CVD process, the oxidized state of a thin film to be deposited greatly depends on whether or not source compounds have metal-oxygen bonds. At present, commercially available source materials for bismuth (Bi) are triphenylbismuth and its analogous compounds only, and these compounds have no metal-oxygen bonds. Accordingly, in the case of depositing a bismuth layered ferroelectric thin film by the CVD process, the following two-step reaction is required.

(A) Decomposition of triphenylbismuth and production of metallic bismuth.

(B) Oxidation of the metallic bismuth by oxygen in the oxygen atmosphere.

Therefore, it is hard to avoid formation of a ferroelectric thin film containing oxygen defects (oxygen vacancies). Accordingly, even by both the processes, that is, the MOD process and the CVD process, solution of the problem of oxygen defects (oxygen vacancies) would be very difficult in the absence of development of new source compounds or development of a new forming method for a ferroelectric thin film.

In these circumstances, the best forming method for a ferroelectric thin film having desired crystallinity and physical properties to solve the problem of oxygen defects (oxygen vacancies) is considered to have a step of depositing a ferroelectric thin film and a step of postannealing the ferroelectric thin film. As a postanneal process for a thin film of oxide materials, heat treatment (anneal) in an oxygen gas is generally known. However, in many cases, this process cannot sufficiently remove oxygen defects (oxygen vacancies) from the ferroelectric thin film. As a result, unoxidized bismuth remains as a metal in the surface layer of the ferroelectric thin film. Further, since the heat treatment (anneal) in the oxygen gas is performed usually at about 800° C., there occurs another problem such that defects tend to be generated in the ferroelectric thin film by the heat in the heat treatment.

SUMMARY OF THE INVENTION

In accordance with an aspect of the present invention, there is provided a forming method for a ferroelectric thin film, wherein the ferroelectric thin film is subjected to heat treatment in an active oxygen atmosphere.

In accordance with another aspect of the present invention, there is provided a manufacturing method for a capacitor structure in a semiconductor device, comprising the steps of (a) forming a bottom electrode layer on a substrate; (b) forming a ferroelectric thin film on the bottom electrode layer, and next subjecting the ferroelectric thin film to heat treatment in an active oxygen atmosphere; and (c) forming an upper electrode layer on the ferroelectric thin film.

In the manufacturing method for the capacitor structure in the semiconductor device according to the present invention, the bottom electrode layer may be formed from platinum (Pt), La—Sr—Co—O (which will be hereinafter abbreviated to LSCO) having a perovskite structure, or a two-layer structure of Pt/LSCO. The upper electrode layer may be formed from Pt, aluminum-based alloy, or a two-layer structure of Pt/LSCO. Optionally, a buffer layer of bismuth titanate ($Bi_4Ti_3O_{12}$, which will be hereinafter abbreviated to BTO), for example, may be formed beneath the lower electrode layer, and a base layer of amorphous material or stabilized zirconia may be formed beneath the buffer layer.

In the forming method for the ferroelectric thin film or the manufacturing method for the capacitor structure in the semiconductor device according to the present invention, the active oxygen atmosphere may be an oxygen atmosphere containing an oxidizing gas. In this case, ozone, $N_2O$, or $NO_2$ may be used as the oxidizing gas. Ozone gradually decomposes at room temperature to generate an oxygen molecule and atomic oxygen. In the case of performing heat treatment in the oxygen atmosphere containing the oxidizing gas of ozone, it is desirable to set the ozone concentration to 1 to 10 wt. %, preferably, 5 to 8 wt. %, the atmosphere temperature to 300 to 600° C., preferably, 400 to 500° C., and the heat treatment time to 10 to 120 min, preferably, 30 to 60 min, in consideration of diffusion of oxygen in the ferroelectric thin film. On the other hand, $N_2O$ decomposes at about 500° C. to generate nitrogen and atomic oxygen. In the case of performing heat treatment in the oxygen atmosphere containing the oxidizing gas of $N_2O$, it is desirable to set the concentration of $N_2O$ to 1 to 20 wt. %, preferably, 10 to 15 wt. %, the atmosphere temperature to 400 to 700° C., preferably, 500 to 600° C., and the heat treatment time to 10 to 120 min, preferably, 30 to 60 min, in consideration of diffusion of oxygen in the ferroelectric thin film. Further, in the case of performing heat treatment in the oxygen atmosphere containing the oxidizing gas of $NO_2$, it is desirable to set the concentration of $NO_2$ to 1 to 20 wt. %, preferably, 10 to 15 wt. %, the atmosphere temperature to 400 to 700° C., preferably, 500 to 600° C., and the heat treatment time to 10 to 120 min, preferably, 30 to 60 min, in consideration of diffusion of oxygen in the ferroelectric thin film.

Alternatively, the active oxygen atmosphere may be obtained by plasma excitation of oxygen or by ultraviolet light excitation of ozone and/or oxygen.

The selection from the above methods to obtain the active oxygen atmosphere may be decided according to heat treatment temperature, oxidizing power of the active oxygen atmosphere, etc. in consideration of the property of the ferroelectric thin film as a target of heat treatment.

In the forming method for the ferroelectric thin film or the manufacturing method for the capacitor structure in the semiconductor device according to the present invention, the ferroelectric thin film is formed of a Bi-based layer-structural perovskite type ferroelectric material. Examples of the Bi-based layer-structural perovskite type ferroelectric material include $Bi_2SrTa_2O_9$, $Bi_2SrNb_2O_9$, $Bi_2BaTa_2O_9$, $Bi_4SrTi_4O_{15}$, $Bi_4Ti_3O_{12}$, $Bi_2Sr(Ta_xNb_{2-x})O_9$, and $Bi_2PbTa_2O_9$. Of these examples, the ferroelectric thin film is formed preferably of materials $Bi_2(Sr, Ba, Ca)(Ta, Nb)_2O_9$. A preferable one of the materials is $Bi_2SrTa_2O_9$. Examples Example of the forming method for the ferroelectric thin film in the present invention include a zol-gel process, a spin-coat process such as an MOD process, an LSMCD (Liquid Source Misted Chemical Deposition) process as an improvement of the spin-coat process, a CVD process using organic metals or metal halides as source materials, and a flash CVD process by feeding and mixing source materials in a liquid phase, and rapidly evacuating an vaporizing chamber to vaporize the source materials. Physical deposition processes as the film forming method may include a vacuum deposition process, a molecular beam deposition process, a PLD (Physical Laser Deposition) process by laser ablation, and a sputtering process.

In the present invention, the atomic oxygen having an oxidizing capability much greater than that of an oxygen gas in related art used for heat treatment in an oxidative atmosphere is introduced into a gas atmosphere, or the atomic oxygen is contained in the gas atmosphere. That is, the ferroelectric thin film is subjected to heat treatment in an active oxygen atmosphere, thereby securely oxidizing metal atoms in the ferroelectric thin film to reduce oxygen defects in the ferroelectric thin film. Furthermore, heat treatment temperature can be set lower than the related art heat treatment (anneal) temperature in an oxygen gas, thereby securely avoiding the problem that defects tend to be generated in the ferroelectric thin film by the heat in the heat treatment.

DETAILED DESCRIPTION OF THE PREFERRED EMBODIMENTS

Figure 1:
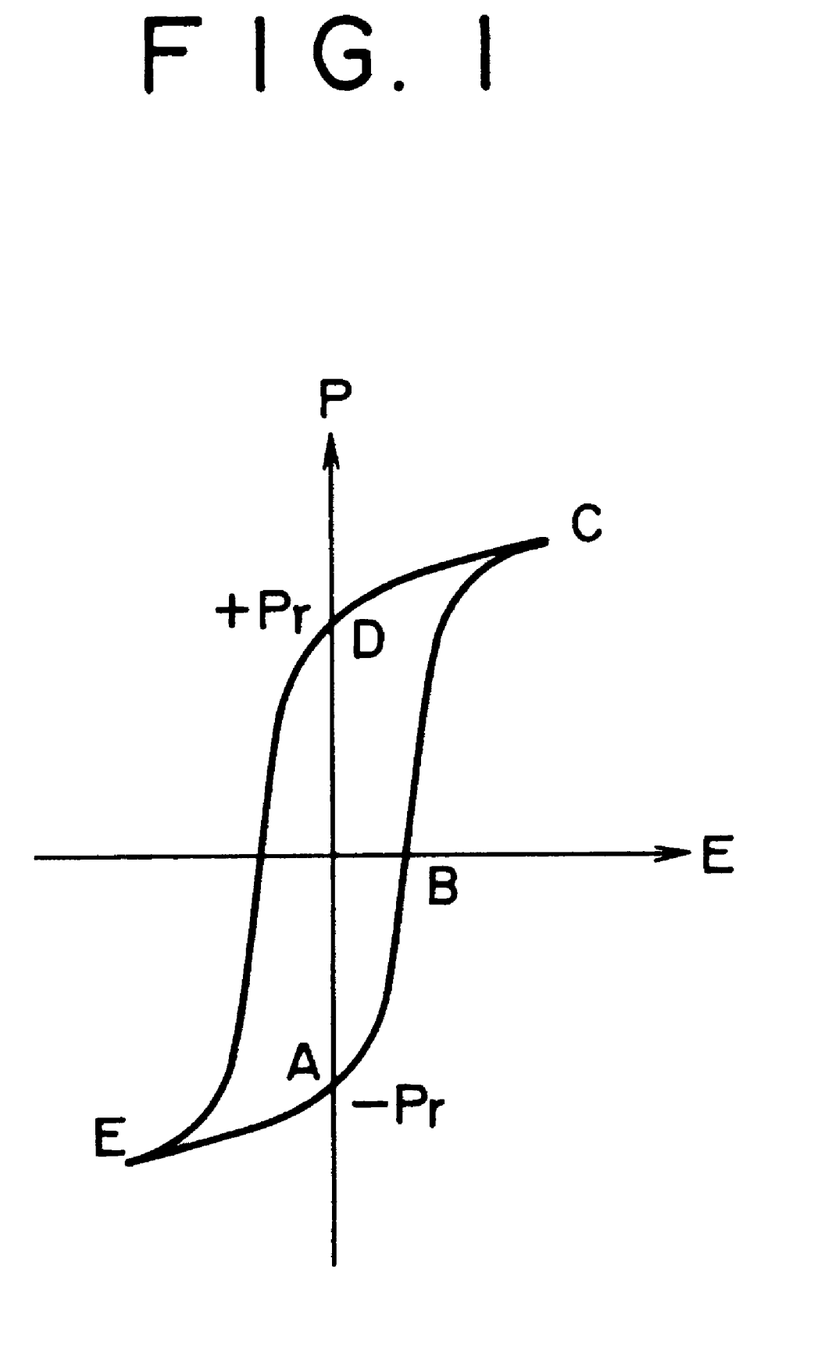
FIG. 1 is a graph showing a P-E hysteresis loop of a ferroelectric.

A nonvolatile memory cell of such a type that a change in quantity of stored charge in a ferroelectric capacitor is detected applies a P-E hysteresis loop of a ferroelectric as shown in FIG. 1.

A ferroelectric thin film displays spontaneous polarization when applying an external electric field to the ferroelectric thin film and thereafter removing the external electric field. The residual polarization of a ferroelectric thin film becomes +Pr when applying an external electric field having a positive direction, and becomes −Pr when applying an external electric field having a negative direction. The state where the residual polarization is +Pr (see "D" in FIG. 1) is regarded as "0", and the state where the residual polarization is −Pr (see "A" in FIG. 1) is regarded as "1".

To determine the state "1" or the state "0", an external electric field having a positive direction, for example, is applied to the ferroelectric thin film. As a result, the polarization of the ferroelectric thin film becomes a state shown by "C" in FIG. 1. If data is "0" at this time, the polarization of the ferroelectric thin film changes from the state "D" to the state "C". Conversely, if data is "1", the polarization of the ferroelectric thin film changes from the state "A" through a state "B" to the state "C". In the case of data "0", no polarization inversion occurs in the ferroelectric thin film, whereas in the case of data "1", polarization inversion occurs in the ferroelectric thin film. As a result, a difference occurs in quantity of stored charge in the ferroelectric capacitor. By turning on a select transistor in a memory cell selected, this stored charge is detected as a signal current. When the external electric field is nullified after reading out the data, the polarization of the ferroelectric thin film becomes the state "D" shown in FIG. 1 irrespective of whether the data is "0" or "1". Therefore, when the data is "1", an external electric field having a negative direction is applied to thereby change the state "D" through a state "E" to the state "A", thus writing data "1".

EXAMPLE 1

Example 1 relates to a forming method for a ferroelectric thin film according to the present invention. In Example 1, a ferroelectric thin film of $Bi_2SrTa_2O_9$ as one of Y1 materials, formed by MOD was subjected to heat treatment in an oxygen atmosphere containing an oxidizing gas of ozone. The following materials were used as source materials in the MOD.

Bi Source: bismuth n-octanoate $(Bi(OOCC_7H_{15})_3)$

Sr Source: strontium 2-ethylhexanoate $(Sr(OOCCH(C_2H_5)C_4H_9)_2)$

Ta Source: tantalum 2-ethylhexanoate $(Ta(OOCCH(C_2H_5)C_4H_9)_5)$

These material compounds were mixed in a given molar ratio in a solvent (2-methoxyethanol), and solvent substitution was carried out to obtain a xylene solution. This source material solution was applied to a platinum (Pt) substrate by spin coating. The spin coating was carried out three times (at a rotating speed of 2500 rpm) to form a three-layer thin film. After forming the thin film having a thickness of about 200 nm, containing the three elements (Bi, Sr, Ta) in this manner, the thin film was subjected to drying and baking under the following conditions.

(1) Drying: 100° C.×3 min, next 150° C.×5 min, next 250° C.×5 min.

(2) Rapid Baking: Heating up to 725° C. at a rate of 125° C./min after drying, and next maintaining this heated condition for 30 sec.

(3) Final Baking: 800° C.×60 min with a flow of oxygen.

By such a drying and baking step, a ferroelectric thin film containing $Bi_2SrTa_2O_9$ as a main phase was obtained.

The ferroelectric thin film thus obtained was next subjected to heat treatment in an oxygen atmosphere containing an oxidizing gas of zone. More specifically, the ferroelectric thin film was subjected to heat treatment in an atmospheric-pressure oxygen atmosphere containing 5 wt. % of ozone at 400° C. for 1 hour. In performing such heat treatment, it is preferable to use a cold-wall type heat treatment apparatus capable of effectively withdrawing a strong oxidizing capability of ozone, as proposed in Japanese Patent Laid-open No. Hei 3-47532 by the present applicant.

Figure 2:
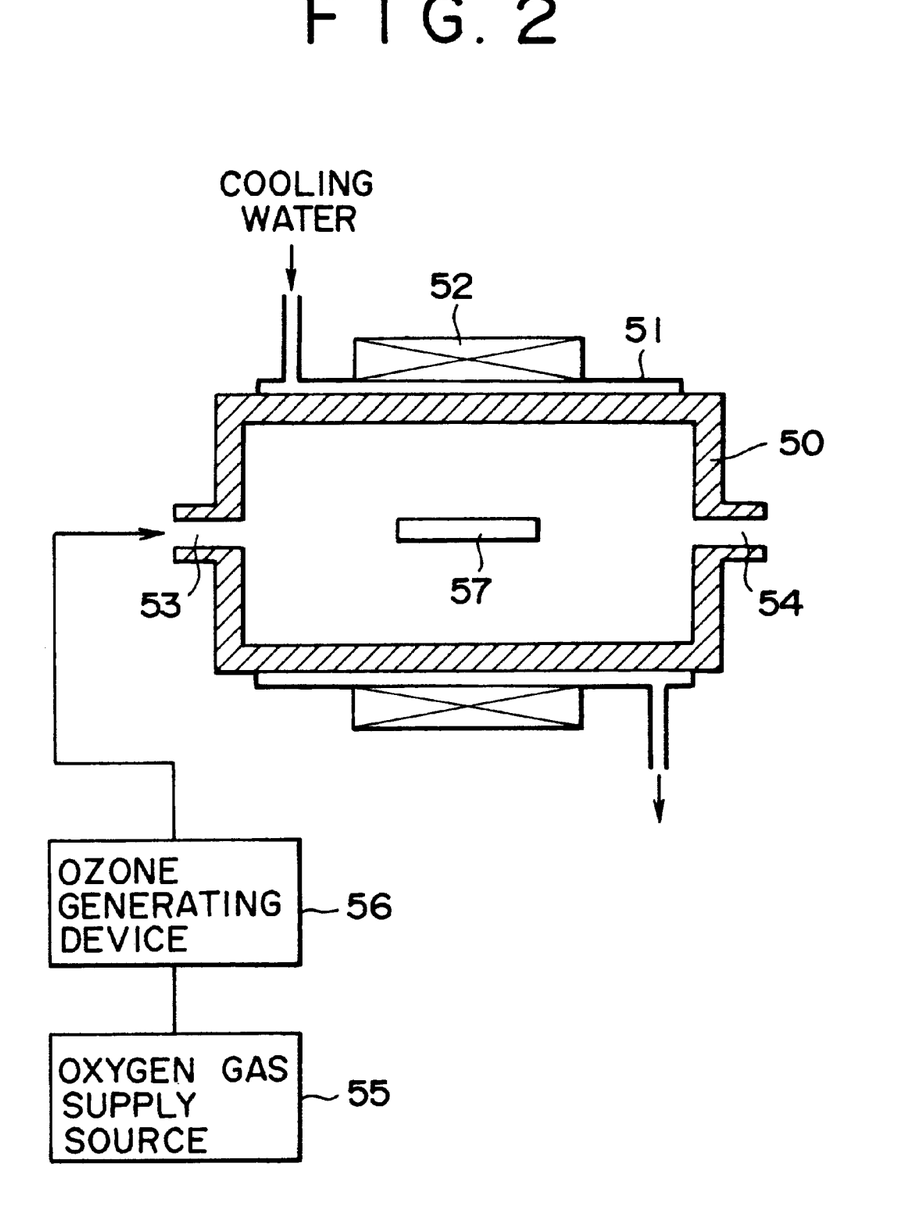
FIG. 2 is a view showing a cold-wall type heat treatment apparatus suitably applicable in performing heat treatment in Example 1.

As shown in FIG. 2, such a cold-wall type heat treatment apparatus is composed of a heat treatment reactor 50 of a quartz tube, a cooling jacket 51 surrounding the heat treatment reactor 50, and a heating means 52 surrounding the cooling jacket 51. A cooling water or air is allowed to flow in the cooling jacket 51, thereby water-cooling or air-cooling the wall surface of the heat treatment reactor 50. The heating means 52 is constructed of an infrared lamp or an induction heating coil, which can heat a ferroelectric thin film as a target 57 placed in the heat treatment reactor 50. The heat treatment reactor 50 is provided with a gas inlet 53 for supplying an oxygen gas containing an oxidizing gas of ozone into the heat treatment reactor 50 and a gas outlet 54 for ejecting the oxygen gas out of the heat treatment reactor 50. An oxygen gas supplied from an oxygen gas supply source 55 of an oxygen cylinder or the like is passed through an ozone generating device 56 to become the oxygen gas containing the oxidizing gas of zone. This oxygen gas is supplied through the gas inlet 53 into the heat treatment reactor 50.

Since the wall surface of the heat treatment reactor 50 is cooled by the cooling jacket 51, the ozone is hardly pyrolyzed in the vicinity of the wall surface of the heat treatment reactor 50. On the other hand, the target 57 is heated by the heating means 52, so that the ozone is pyrolyzed only in the vicinity of the target 57 to create an active oxygen atmosphere in the vicinity of the target 57.

Figure 3:
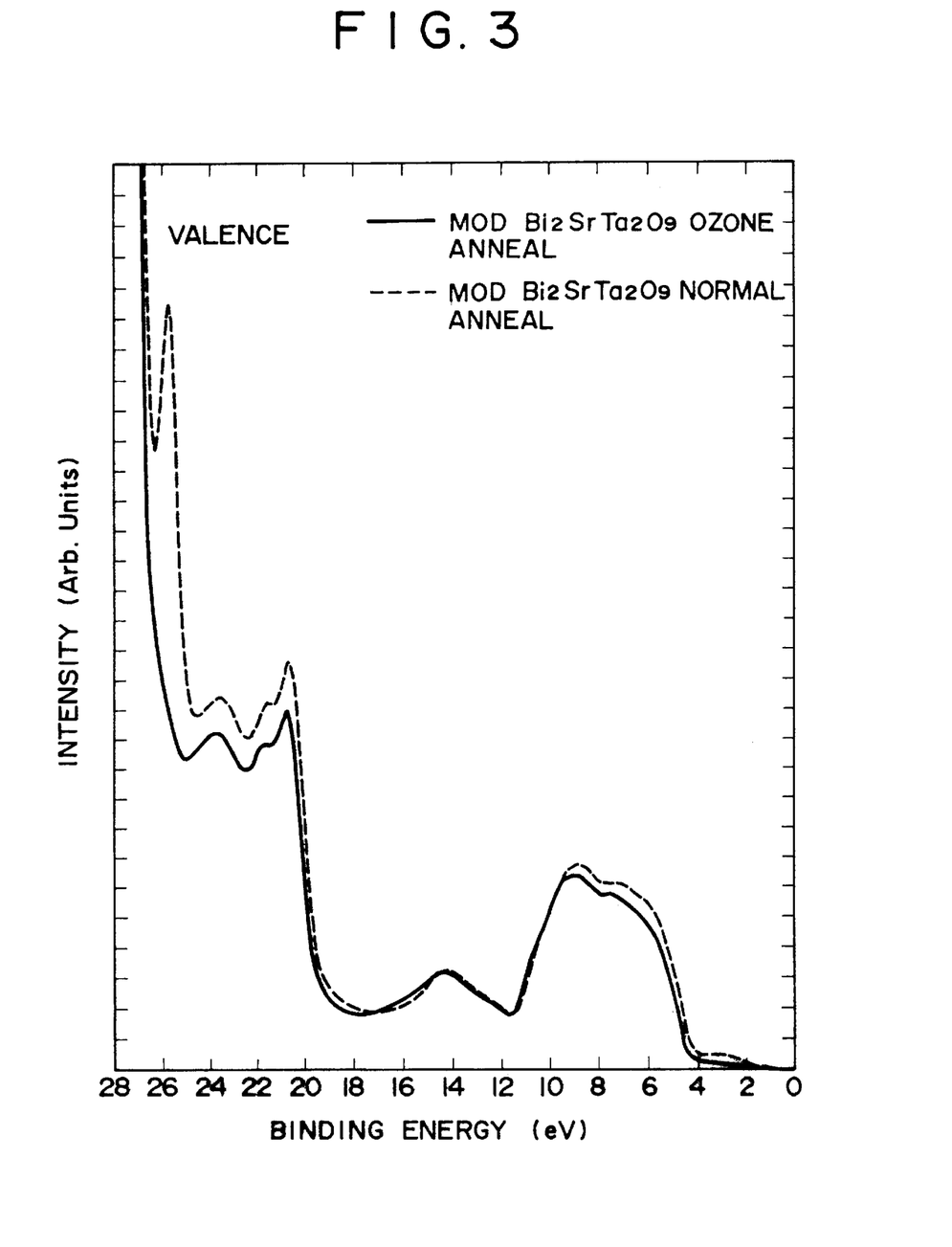
FIG. 3 is a graph showing a result of analysis of the states of bismuth in a ferroelectric thin film before and after heat treatment by using X-ray photoelectron spectroscopy.

FIG. 3 shows a result of analysis of the states of bismuth in the ferroelectric thin film before and after subjected to the ozone anneal, by using X-ray photoelectron spectroscopy. In the ferroelectric thin film before subjected to the ozone anneal, it is apparent that metallic bismuth is present on the surface of the ferroelectric thin film (Binding Energy=25.7 eV and 3 eV). On the other hand, in the ferroelectric thin film after subjected to the ozone anneal, it is apparent that these peaks have completely disappeared, that is, the metallic bismuth has already become absent.

EXAMPLE 2

Example 2 relates also to a forming method for a ferroelectric thin film according to the present invention. In Example 2, a ferroelectric thin film of $Bi_2SrTa_2O_9$ as one of bismuth layer structured materials, formed by MOD was subjected to heat treatment in an oxygen atmosphere containing an oxidizing gas of $N_2O$. The forming method for the ferroelectric thin film is similar to that mentioned in Example 1.

In Example 2, the ferroelectric thin film formed was subjected to heat treatment in an oxygen atmosphere containing an oxidizing gas of $N_2O$. More specifically, the ferroelectric thin film was subjected to heat treatment in an atmospheric-pressure oxygen atmosphere containing 10 wt. % of $N_2O$ at 500° C. for 1 hour. In the case of using $N_2O$, a heat treatment apparatus similar to that mentioned in Example 1 may be used; however, a normal heat treatment apparatus may also be used because the decomposition temperature of $N_2O$ is 100 to 200° C. that is higher than that of ozone.

Example 3

Example 3 relates to a manufacturing method for a capacitor structure in a semiconductor device according to the present invention. In Example 3, a ferroelectric thin film of $Bi_2SrTa_2O_9$ as one of bismuth layer structured materials, formed by MOCVD was subjected to heat treatment in an oxygen atmosphere containing an oxidizing gas of ozone. The manufacturing method for a capacitor structure in a semiconductor device in Example 3 will now be described with reference to FIGS. 4A to 4G which are schematic sectional views of a part of a semiconductor substrate and its associated components. The semiconductor device in Example 3 is a semiconductor memory cell classified as an FERAM of such a type that a change in quantity of stored charge in a ferroelectric capacitor is detected.

[Step 1]

Figure 4A:
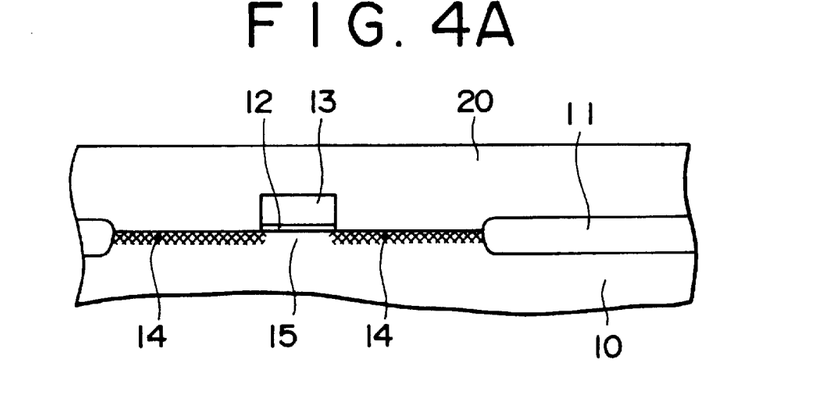
FIGS. 4A to 4G are sectional views showing steps of a manufacturing method for a ferroelectric memory cell in Example 3.

First, a device isolating region 11 having a LOCOS structure is formed on a silicon semiconductor substrate 10 according to a known method. The surface of the semiconductor substrate 10 is next oxidized to form a gate oxide film 12. A polysilicon layer is deposited on the entire surface by CVD, for example, and is next patterned by photolithography and etching to form a gate electrode 13 of polysilicon. The gate electrode 13 serves also as a word line. Ion implantation of impurity ions and activation of the impurity implanted are performed to form source and drain regions 14 and a channel region 15. Thus, a semiconductor device (select transistor) is formed.

The device isolating region 11 having the LOCOS structure may be replaced by a device isolating region having a trench structure. Although the gate electrode 13 is formed of polysilicon, it may be formed of polycide or metal silicide.

[Step 2]

An insulating layer 20 as a base layer of an amorphous material is next formed on the semiconductor substrate 10. For example, the insulating layer 20 of BPSG as an amorphous material is deposited on the entire surface by CVD, for example. Thus, the structure shown in FIG. 4A can be obtained. Preferably, after forming the insulating layer 20 of BPSG, the insulating layer 20 is subjected to reflow at 900° C. for 20 min, for example. Further, as required, it is desirable to perform planarization of the insulating layer 20 by chemically and mechanically polishing the upper surface of the insulating layer 20, using chemical-mechanical polishing (CMP), or by resist etch-back, for example. The film deposition conditions of the insulating layer 20 are as follows, for example.

Source Gases: $SiH_4/PH_3/B_2H_6$

Film Deposition Temperature: 400° C.

Reaction Pressure: Atmospheric Pressure

Known examples of the materials of the insulating layer 20 instead of BPSG include $SiO_2$, PSG, BSG, ASSG, PbSG, SbSG, SOG, SiON, SiN, NSG, and LTO. One or more of these insulating materials may be used to form one layer of laminated layers. Alternatively, the insulating layer 20 as a base layer may be formed from stabilized zirconia (YSZ), i.e., zirconium oxide $ZrO_2$ to which yttrium oxide, $Y_2O_3$, was added. Such a base layer of stabilized zirconia may be formed by MOCVD or pulsed layer deposition under given conditions to be hereinafter described. Before forming the base layer of stabilized zirconia, an interlayer insulating layer of $SiO_2$, for example, is preliminarily formed on the semiconductor device (select transistor).

Film Deposition Conditions by MOCVD:

Source Materials: $Zr(C_4H_9O)_4$ $Y(DPM)_3$ [DPM: dipivaloylmethanoate]

Film Deposition Temperature: 550–650° C.

Film Deposition Pressure: 27–400 Pa

Oxygen Concentration: 50%

Film Deposition Conditions by Pulsed Laser Deposition:

Target: $ZrO_2/Y$

Laser Used: KrF excimer laser (wavelength: 248 nm; pulse width: 25 nsec; 5 Hz; 1.1 J/cm$^2$)

Film Deposition Temperature: 500° C.

Oxygen Concentration: 3 Pa

[Step 3]

Preferably, a buffer layer 21 is formed on the insulating layer 20; however, this step is not essential. More specifically, the buffer layer 21 of polycrystalline BTO with orientation along its c-axis (i.e., the c-axis of BTO is perpendicular to the surface of the insulating layer 20) is formed by pulsed layer deposition (pulsed layer ablation) (see FIG. 4B). The thickness of the buffer layer 21 was set to 0.01 to 0.02 μm. The film deposition conditions of the buffer layer 21 are as follows, for example.

Target: BTO

Laser Used: KrF excimer laser (wavelength: 248 nm; pulse width: 25 nsec; 3 Hz)

Film Deposition Temperature: 600–770° C.

Oxygen Concentration: 7–27 Pa

Film Deposition Rate: 0.05–0.1 nm/sec

Figure 4B:
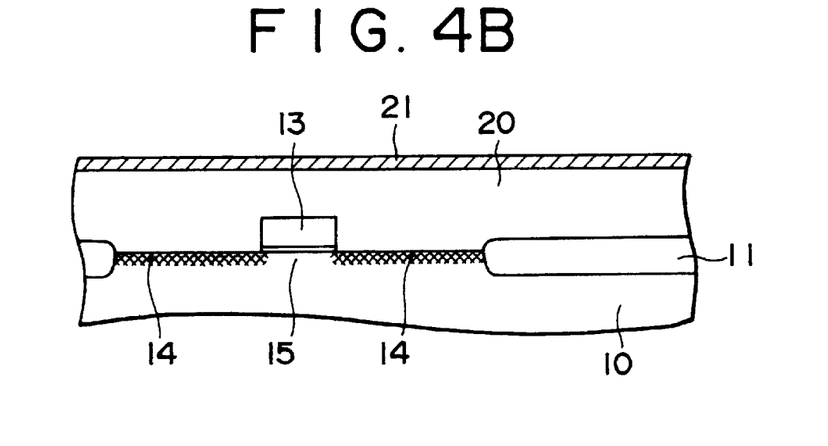

The buffer layer 21 of BTO may be formed by MOCVD. In this case, triphenylbismuth, for example, is used as the source gas for Bi, and tetraisopropoxytitanium, for example, is used as the source gas for Ti. By using these source gases, oxygen gas, and argon gas, a buffer layer of BTO having high orientation (i.e., oriented along its c-axis) can be formed on the base layer in an MOCVD apparatus by MOCVD. In this case, film deposition is performed preferably in the condition that the semiconductor substrate is maintained at about 700° C.

[Step 4]

Thereafter, a lower electrode layer 22 is formed on the buffer layer 21. That is, the lower electrode layer 22 of Pt is deposited on the buffer layer 21 by RF magnetron sputtering. The thickness of the lower electrode layer 22 was set to 0.1 to 0.2 μm. The film deposition conditions by the RF magnetron sputtering will be illustrated below. Since the buffer layer 21 is formed of polycrystalline BTO oriented along the c-axis, the lower electrode layer 22 of Pt has a {100} plane. In other words, the {100} plane of Pt forming the lower electrode layer 22 is parallel to the surface of the buffer layer 21.

Film Deposition Conditions by RF Magnetron Sputtering:

Anode Voltage: 2.6 kV

Input Power: 1.1–1.6 W/cm$^2$

Process Gases: $Ar/O_2$ 32 90/10

Pressure: 0.7 Pa

Film Deposition Temperature: 600–750° C.

Deposition Rate: 5–10 nm/min

Alternatively, the lower electrode layer of Pt {100} may be deposited by pulsed layer deposition. The film deposition conditions of Pt{100} by pulsed layer deposition are as follows, for example.

Film Deposition Conditions by Pulsed Laser Deposition:

Target: Pt

Laser Used: KrF excimer layer (wavelength: 248 nm; pulse width: 25 nsec; 5 Hz; 1.1 J/cm$^2$)

Film Deposition Temperature: 500–600° C.

Further, the lower electrode layer may be formed of LSCO/Pt{100}, wherein LSCO forms a lower layer. The film deposition conditions of LSCO by pulsed laser ablation are as follows, for example.

Target: LSCO

Laser Used: KrF excimer laser (wavelength: 248 nm; pulse width: 25 nsec; 3 Hz)

Output Energy: 400 mJ (1.1 J/cm$^2$)

Film Deposition Temperature: 500–600° C.

Oxygen Concentration: 40–120 Pa

Figure 4C:
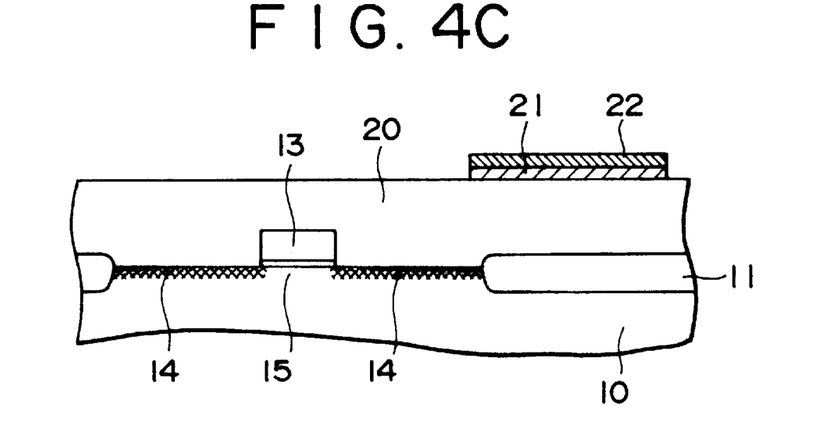

Thereafter, the lower electrode layer 22 is patterned to a desired shape by ion milling, for example, and the buffer layer 21 is next patterned to a desired shape by RIE, for example (see FIG. 4C).

[Step 5]

Thereafter, a ferroelectric thin film 23 is formed on the lower electrode layer 22. More specifically, the ferroelectric thin film 23 of a Bi-based layer-structural perovskite type ferroelectric material is epitaxially grown by MOCVD. The ferroelectric thin film 23 has a (100) plane. In other words, the direction of the ferroelectric thin film 23 epitaxially grown with respect to the surface of the lower electrode layer 22 is [100]. The film deposition conditions of $Bi_2SrTa_2O_9$ as one of bismuth layer structured materials are as follows, for example.

Source Materials: $Sr(C_{11}H_{19}O_2)_2$ $Bi(C_6H_5)_3$ $Ta(OC_2H_5)_5$

Film Deposition Temperature: 650–750° C.

Film Deposition Pressure: 27–400 Pa

Oxygen Concentration: 5%

Alternatively, the ferroelectric thin film may be formed by a method similar to that mentioned in Example 1. Further, the ferroelectric thin film of $Bi_2SrTa_2O_9$ may be formed by pulsed laser ablation under the following conditions.

Target: $Bi_2SrTa_2O_9$

Laser Used: KrF excimer layer (wavelength: 248 nm; pulse width: 25 nsec; 5 Hz)

Film Deposition Temperature: 500° C.

Oxygen Concentration: 3 Pa

[Step 6]

Thereafter, the ferroelectric thin film 23 is subjected to heat treatment in an oxygen atmosphere containing an oxidizing gas of ozone by a method similar to that mentioned in Example 1.

[Step 7]

Thereafter, an upper electrode layer 24 is formed on the ferroelectric thin film 23. The upper electrode layer 24 is formed of Pt{100}. and it may be deposited by a method similar to that mentioned in Step 4.

[Step 8]

Figure 4D:
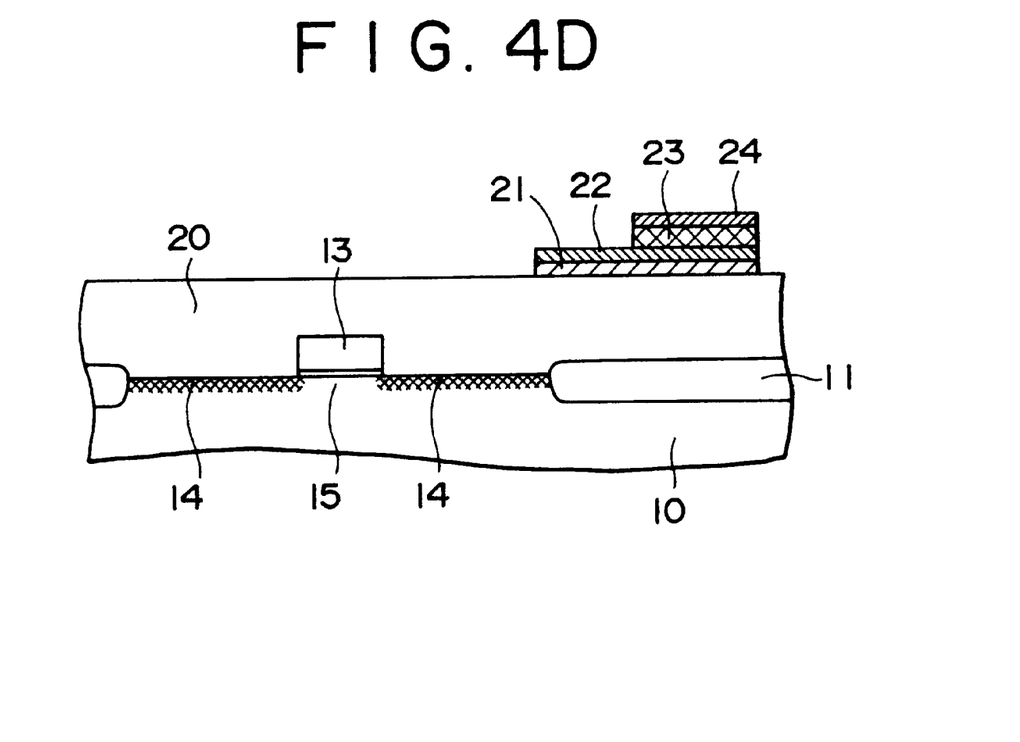

Thereafter, the upper electrode layer 24 of Pt is patterned to a desired shape by ion milling, for example, and the ferroelectric thin film 23 is next p atterned to a desired shape by RIE, for example. Thus, a capacitor structure in a semiconductor device as shown in FIG. 4D can be obtained.

[Step 9]

Thereafter, an upper insulating layer 30 of BPSG, for example, is formed on the insulating layer 20, the lower electrode layer 22, and the upper electrode layer 24. Preferably, after forming the upper insulating layer 30, it is subjected to planarization. Then, an opening 31 is formed through the insulating layer 20 and the upper insulating layer 30 at a position above one of the source and drain regions 14 by using photolithography and etching. Further, openings 32 and 33 are also formed through the upper insulating layer 30 at positions above the lower electrode layer 22 and above the upper electrode layer 24, respectively (see FIG. 4E).

[Step 10]

Figure 4E:
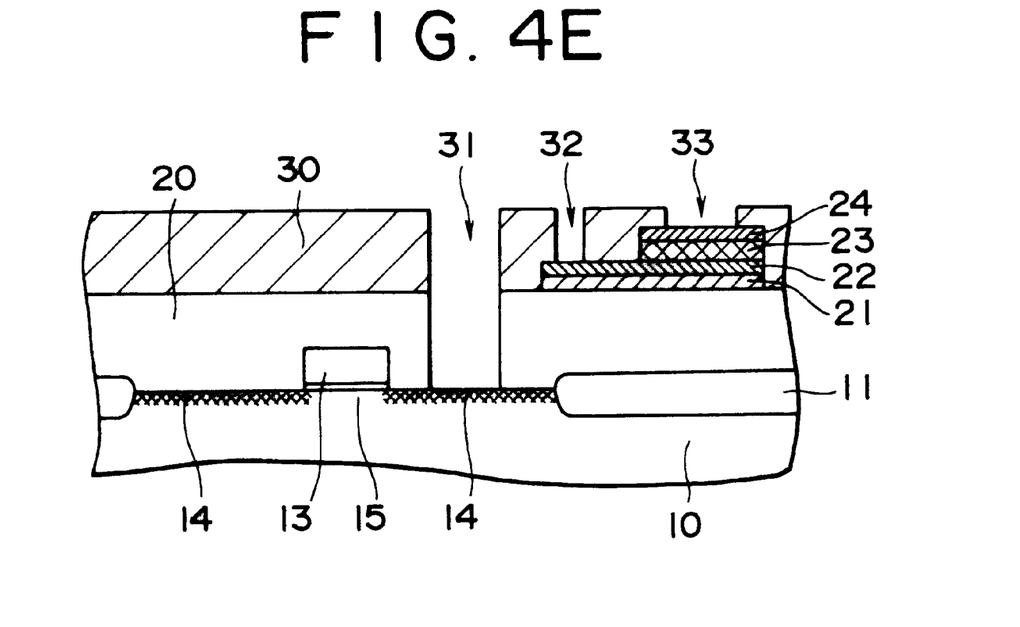

Ther eafter, a Ti layer and a TiN layer are successively formed on the upper insulating layer 30 including the inner surface of each opening by sputtering, for example. Then, a metal wiring material layer of aluminum-based alloy (e.g., Al-1% Si) is formed on the TiN layer by sputtering. The film deposition conditions of the Ti layer, the TiN layer, and the metal wiring material layer of aluminum-based alloy will be illustrated below. The reason for formation of the Ti layer and the TiN layer is to obtain an ohmic, lower contact resistance, prevent occurrence of damages to the semiconductor substrate 10 by the metal wiring material layer of aluminum-based alloy, and improve the wettability of aluminum-based alloy.

Ti Layer (thickness: 20 nm):

Process Gas: Ar=35 sccm

Pressure: 0.52 Pa

RF Power: 2 kW

Substrate Heating: No

TiN Layer (thickness: 100 nm):
  Process Gases: $N_2$/Ar=100/35 sccm
  Pressure: 1.0 Pa
  RF Power: 6 kW
  Subst rate Heating: No Metal wiring Material Layer of Aluminum-based Alloy:
  Process Gas: Ar=100 sccm
  Pressure: 0.26 Pa
  RF Power: 15 kW
  Subst rate Temperature: 475° C.

Thereafter, the semiconductor substrate 10 is heated to 500° C. Accordingly, the metal wiring material layer of aluminum-based alloy deposited on the upper insulating layer 30 becomes a fluidic condition to flow into the openings 31, 32, and 33. As a result, the openings 31, 32, and 33 are completely filled with the aluminum-based alloy to form contact plugs. On the other hand, the metal wiring layer of aluminum-based alloy is formed on the upper insulating layer 30 except the openings. The heating conditions of the semiconductor substrate 10 are as follows, for example.

Heating Method: Substrate Back Surface Gas Heating

Heating Temperature: 500° C.

Heating Time: 2 min

Process Gas: Ar=100 sccm

Process Gas Pressure: $1.1 \times 10^3$ Pa

The substrate back surface gas heating method mentioned above is a method of heating a heater block located on the back side of the semiconductor substrate 10 to a given temperature (heating temperature), and introducing a process gas between the heater block and the back surface of the semiconductor substrate 10, thus heating the semiconductor substrate 10. As another heating method, a lamp heating method or the like may be used.

Although the film deposition of the metal wiring material layer of aluminum-based alloy is performed by so-called high-temperature aluminum sputtering in this step, this method is merely illustrative and any other methods such as so-called high-temperature reflow or high-pressure reflow may be used. In the high-temperature reflow process, a metal wiring material layer of aluminum-based alloy is deposited on the upper insulating layer 30 under the following conditions.

Process Gas: Ar=100 sccm

DC Power: 20 kW

Sputtering Pressure: 0.4 Pa

Substrate Heating Temperature: 150° C.

Figure 4F:
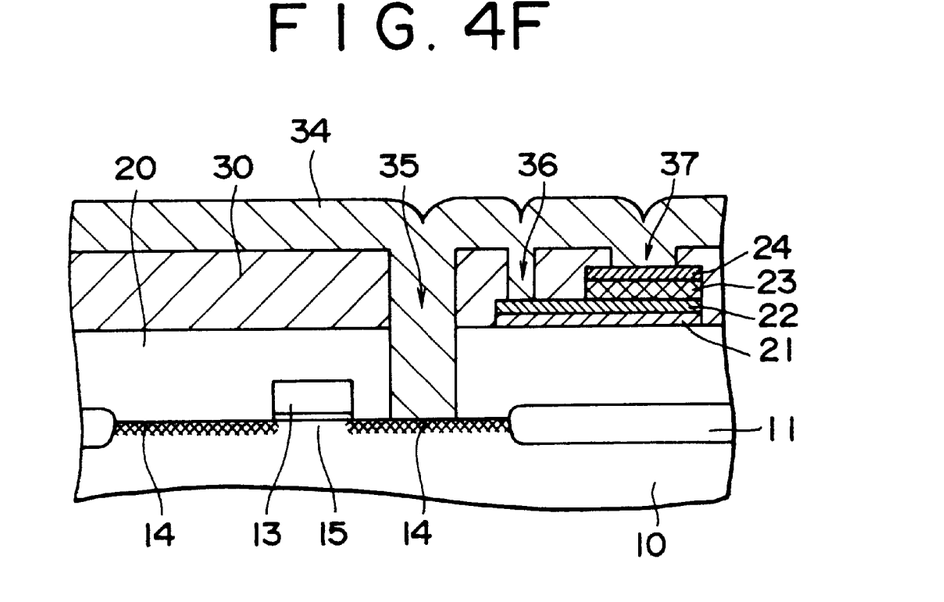
Figure 4G:
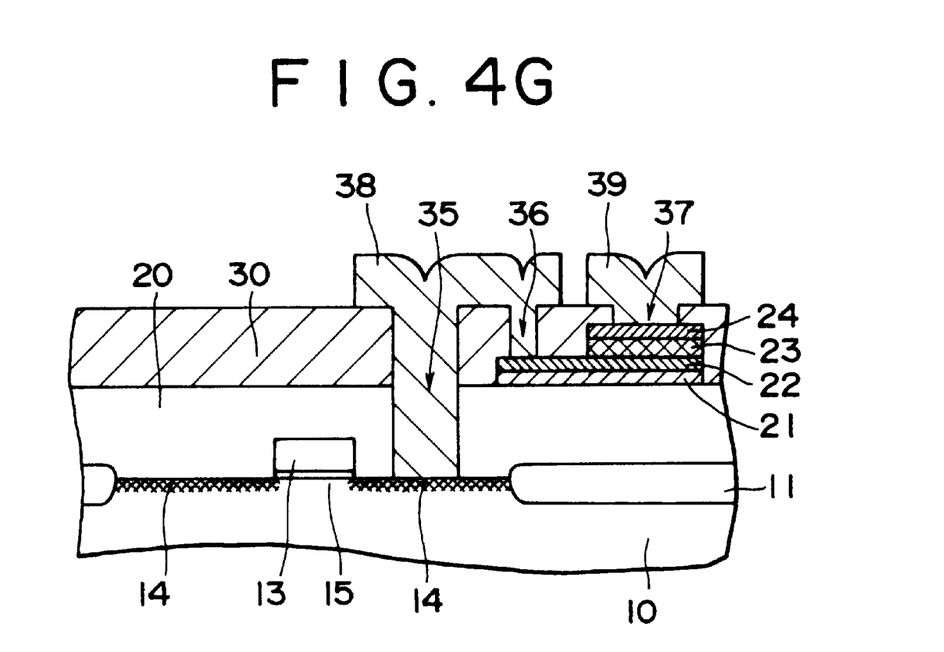

Thus, the openings 31, 32, and 33 are filled with the aluminum-based alloy to form contact plugs 35, 36, and 37, respectively (see FIG. 4F). In FIG. 4F, reference numeral 34 denotes the metal wiring material layer. Thereafter, the metal wiring material layer 34, the TiN layer, and the Ti layer on the upper insulating layer 30 are patterned to form a first wiring layer 38 and a second wiring layer 39 (see FIG. 4G). In FIGS. 4D to 4G, the TiN layer and the Ti layer are not shown.

Figure 5A:
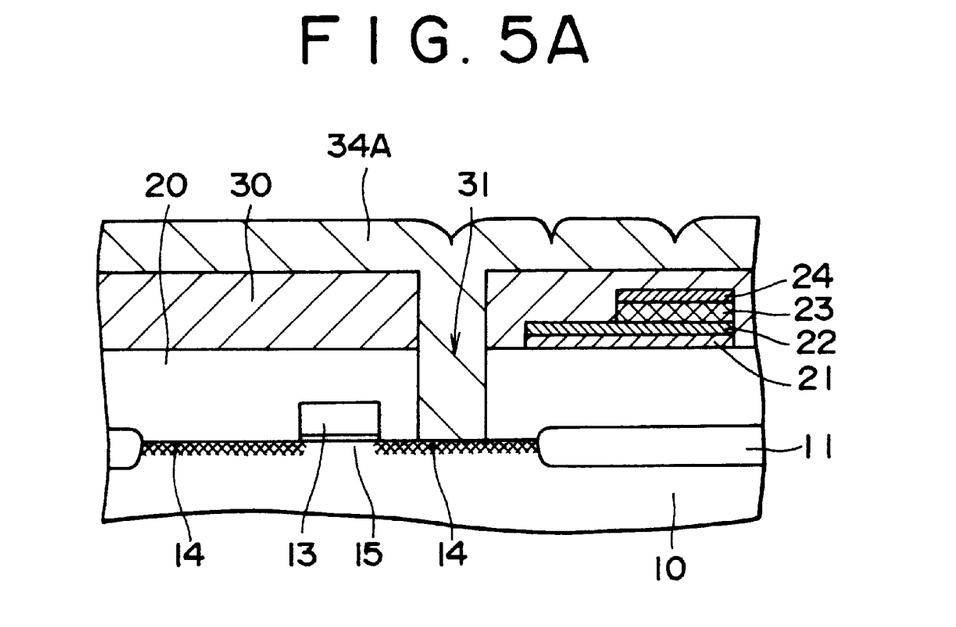
FIGS. 5A to 5D are sectional views showing a modification of the steps of the manufacturing method for the ferroelectric memory cell in Example 3.

The contact plug 35 may be formed by so-called blanket tungsten CVD. In this case, after forming an opening 31 through the insulating layer 20 and the upper insulating layer 30, a Ti layer and a TiN layer are deposited by sputtering similarly to Step 9. Thereafter, a metal wiring material layer 34A of tungsten is deposited on the TiN layer by CVD under the following conditions (see FIG. 5A).

Source Gases: $WF_6/H_2/Ar=40/400/2250$ sccm

Pressure: 10.7 kPa

Film Deposition Temperature: 450° C.

Figure 5B:
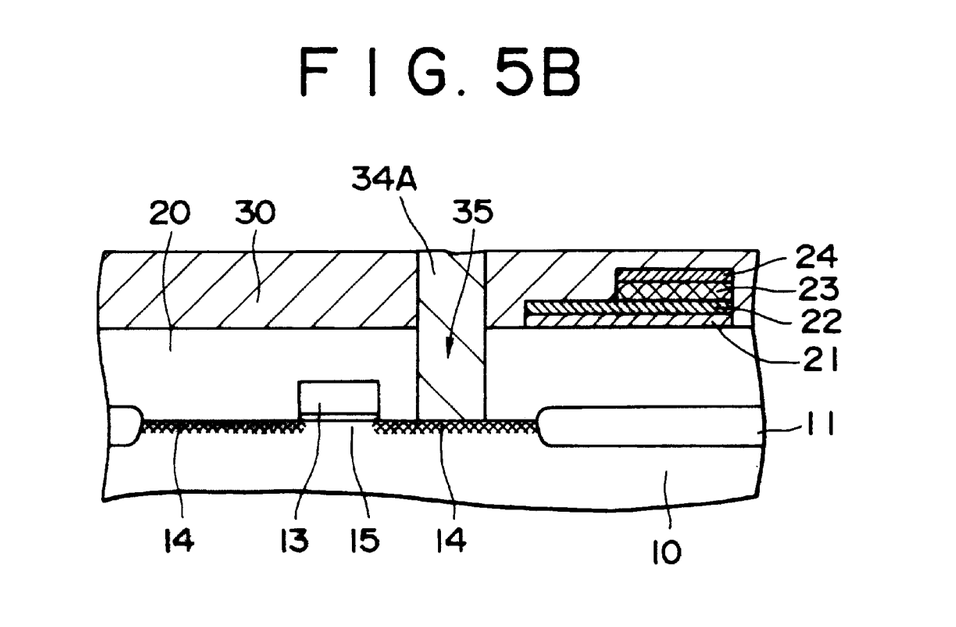

Thereafter, the metal wiring material layer 34A of tungsten, the TiN layer, and the Ti layer on the insulating layer 20 are etched off (see FIG. 5B). The etching conditions are as follows, for example.

Figure 5C:
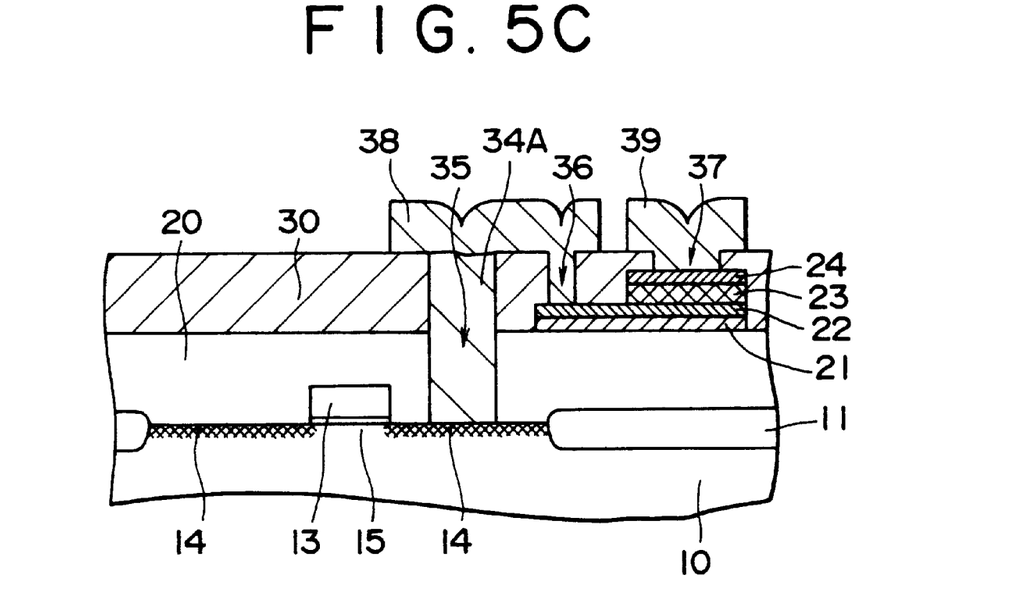

First-Stage Etching: Etching of the tungsten layer
   Etchant Gases: $SF_6$/Ar/He=110/90/5 sccm
   Pressure: 46 Pa
   RF Power: 275 W
Second-Stage Etching: Etching of the TiN layer/Ti layer
   Etchant Gases: Ar/$Cl_2$=75/5 sccm
   Pressure: 6.65 Pa
   RF Power: 250 W Thus, the opening 31 is filled with the tungsten to form a contact plug 35. Thereafter, openings 32 and 33 are formed through the upper insulating layer 30 at positions above the lower electrode layer 22 and above the upper electrode layer 24, respectively. Then, similarly to Step 9, a Ti layer, a TiN layer, and a metal wiring material layer 34 of aluminum-based alloy are formed by sputtering, and next patterned to form a first wiring layer 38 and a second wiring layer 39 (see FIG. 5C). The contact plug 35 may be formed by filling impurity-doped polysilicon into the opening 31.

Figure 5D:
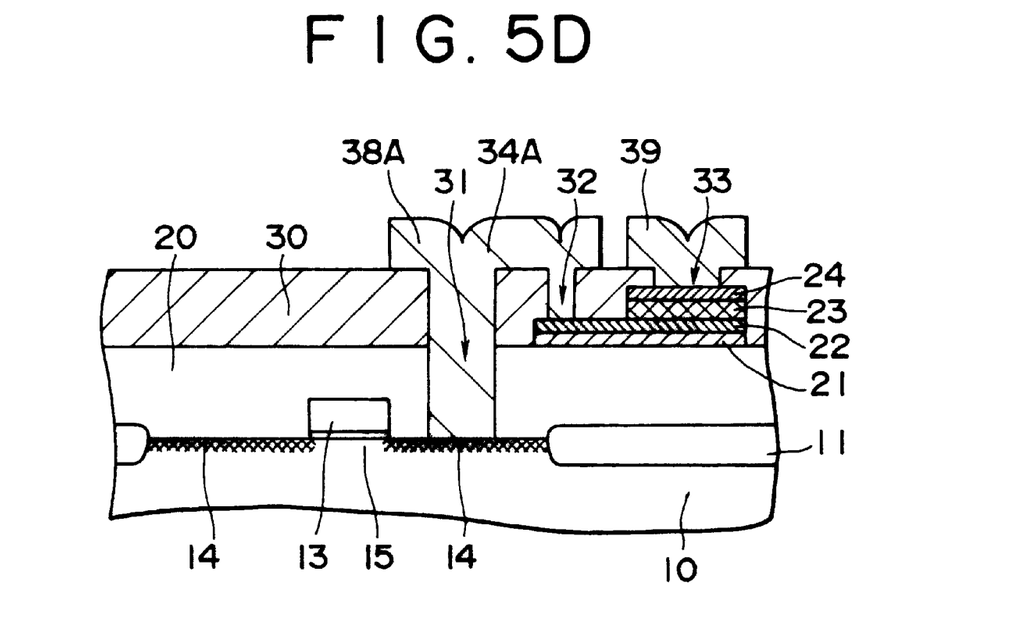

In modification, an opening 31 is formed through the insulating layer 20 and the upper insulating layer 30, and an opening 32 is formed through the upper insulating layer 30 above the lower electrode layer 22. Then, a Ti layer, a TiN layer, and a metal wiring material layer 34A of tungsten are successively formed on the upper insulating layer 30 including the inner surfaces of the openings 31 and 32. Then, the metal wiring material layer 34A of tungsten, the TiN layer, and the Ti layer on the upper insulating layer 30 are patterned to form a first wiring layer 38A of tungsten/TiN/Ti. Thereafter, an opening 33 is formed through the upper insulating layer 30 above the upper electrode layer 24, and similarly to Step 10, a Ti layer, a TiN layer, and a metal wiring material layer of aluminum-based alloy are formed by sputtering and next patterned to form a second wiring layer 39 (see FIG. 5D).

EXAMPLE 4

Figure 6A:
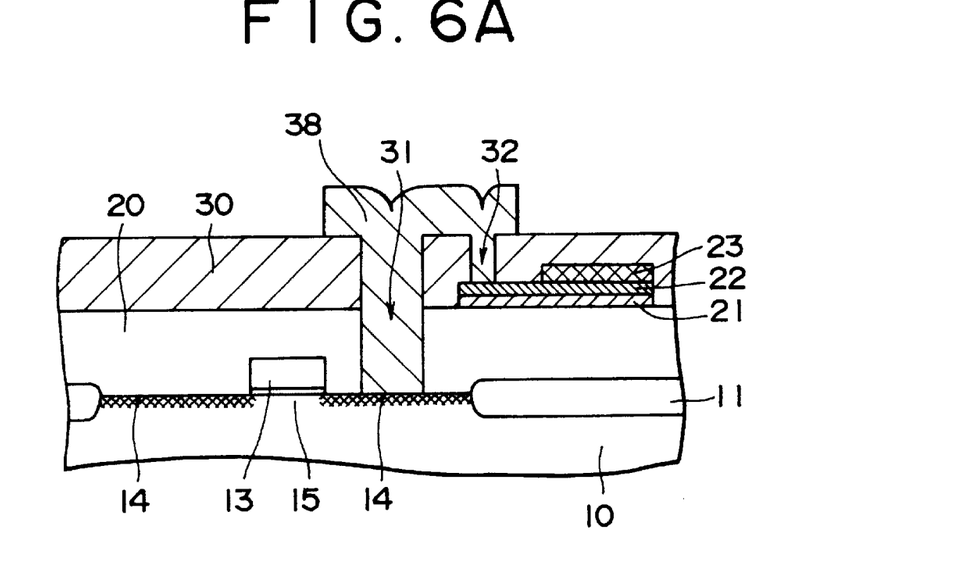
FIGS. 6A and 6B are sectional views showing steps of a manufacturing method for a ferroelectric memory cell in Example 4.
Figure 6B:
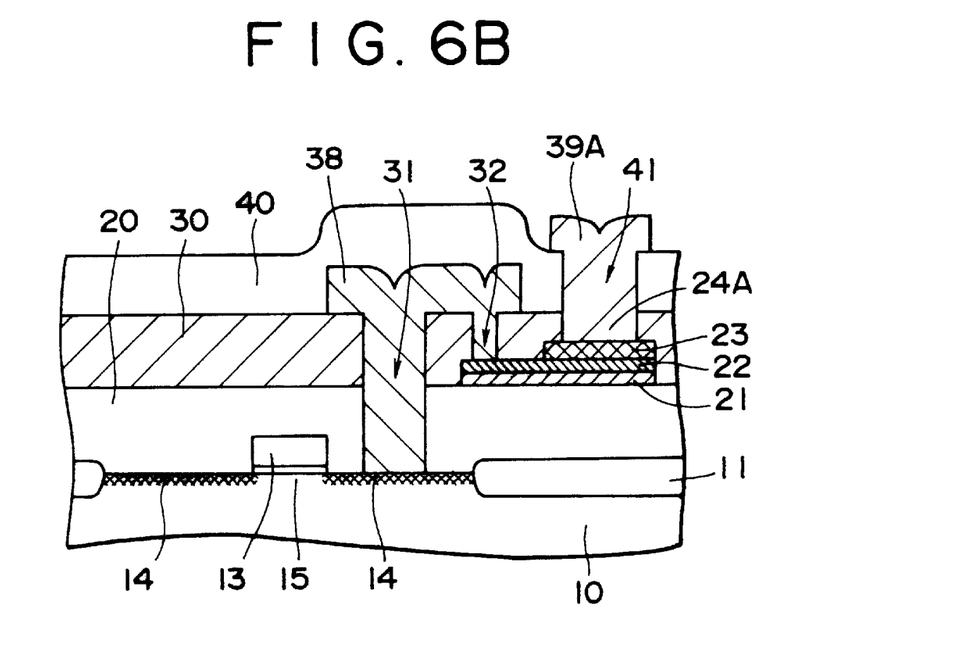

In Example 4, the upper electrode layer serves also as a plate line unlike in Example 3. That is, in forming a capacitor structure in a semiconductor device in Example 4, the ferroelectric thin film 23 after subjected to heat treatment as in Step 6 in Example 3 is patterned to a desired shape. After forming an upper insulating layer 30 on the entire surface, an opening 31 is formed through the insulating layer 20 and the upper insulating layer 30, and an opening 32 is formed through the upper insulating layer 30 above the lower electrode layer 22. Thereafter, a Ti layer, a TiN layer, and a metal wiring material layer 34 of aluminum-based alloy are successively formed on the upper insulating layer 30 including the inner surfaces of the openings 31 and 32. Thereafter, the metal wiring material layer 34, the TiN layer, and the Ti layer on the upper insulating layer 30 are patterned to form a first wiring layer 38 of aluminum-based alloy/TiN/Ti (see FIG. 6A). Thereafter, a second insulating layer 40 of BPSG, for example, is formed on the entire surface. Then, an opening 41 is formed through the upper insulating layer 30 and the second insulating layer 40 at a position above the ferroelectric thin film 23. Then, similarly to Step 7 in Example 3, a Pt film is formed on the second insulating layer 40 including the inner surface of the opening 41. Then, the Pt film on the second insulating layer 40 excepting the Pt film on the inner surface of the opening 41 is selectively removed to be patterned. Accordingly, an upper electrode layer 24A of Pt is formed on the ferroelectric thin film 23. The upper electrode layer 24A extends through the opening 41 up to the upper side of the second insulating layer 40, thereby forming a second wiring layer 39A, which functions also as a plate line (see FIG. 6B). The upper electrode layer 24A and the second wiring layer 39A may be formed of aluminum-based alloy.

Figure 7:
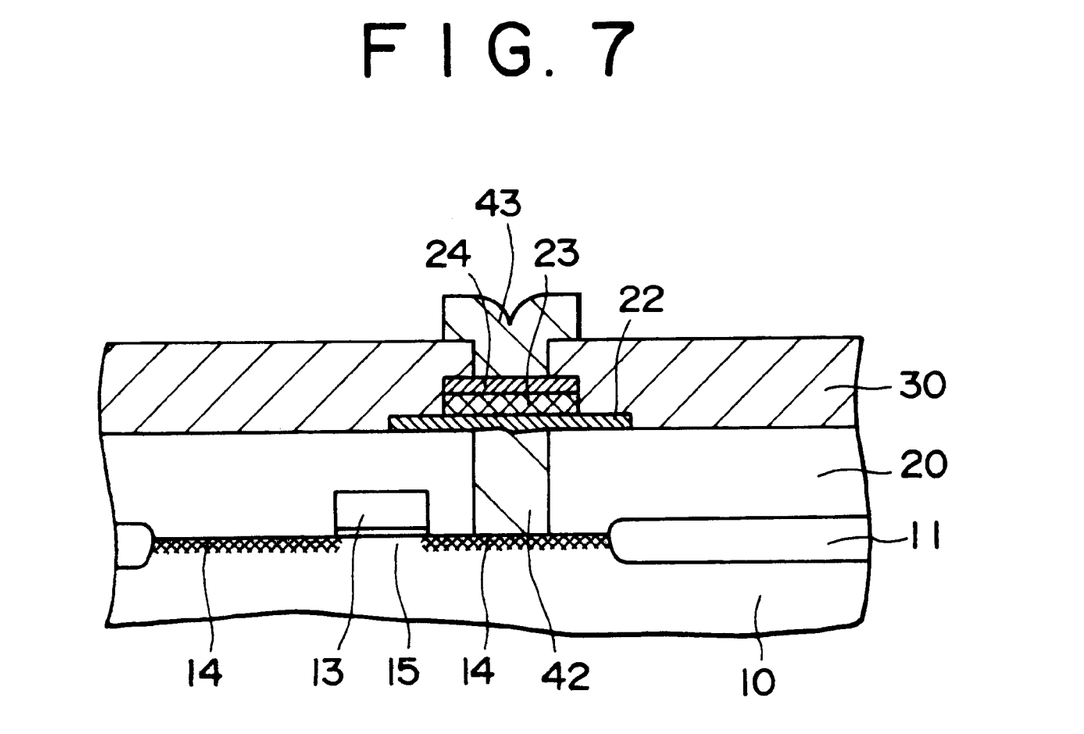
FIG. 7 is a sectional view showing a structure of a ferroelectric memory cell such that a capacitor is stacked on a contact plug.

While there has been described the ferroelectric thin film electrically connected to one of the source and drain regions through the contact plugs and the first wiring layer in each of Examples 3 and 4, another structure of a semiconductor device may be manufactured as shown in FIG. 7, which is a schematic sectional view of a part of the semiconductor device. That is, this structure shown in FIG. 7 is manufactured by forming a contact plug 42 in an insulating layer 20 by blanket tungsten CVD, for example, forming a lower electrode layer 22 connected to the top of the contact plug 42, forming a ferroelectric thin film 23 and an upper electrode layer 24 on the lower electrode layer 22, forming an upper insulating layer 30 on the entire surface, and forming a wiring 43 connected to the upper electrode layer 24. Further, another structure may be manufactured by forming a wiring electrically connected to a contact plug electrically connected to one of source and drain regions, forming another connection hole (e.g., via hole) electrically connected to this wiring, and electrically connecting a ferroelectric thin film to this connection hole. Alternatively, the capacitor structure in the semiconductor device according to the present invention may be formed by forming a buffer layer on a device isolating region.

Having thus described specific examples of the present invention, it is to be noted that the present invention is not limited to these examples. That is, the film deposition methods and conditions, and the numerical values described in each example are merely illustrative, and various changes and modifications may be made within the scope of the present invention. In the forming method for the ferroelectric thin film according to the present invention, the active oxygen atmosphere may be obtained by plasma excitation of oxygen, or by ultraviolet light excitation of ozone and/or oxygen. As a plasma excitation source, an RF plasma device at 13.56 kHz or an ECR plasma device at 2.45 MHz may be used. Such a plasma device may be provided in the heat treatment reactor 50 of the heat treatment apparatus shown in FIG. 2, and a vacuum pump may be connected to the heat treatment reactor 50, wherein the interior of the heat treatment reactor 50 is evacuated to $1.3 \times 10^2$ Pa (1 Torr) or less, thereby creating an environment allowing easy generation of plasma. With this configuration, the active oxygen atmosphere can be efficiently obtained. On the other hand, in applying ultraviolet light excitation, a low-pressure mercury lamp, a halogen lamp, an ArF excimer layer, etc. may be used as an ultraviolet light source. Such a lamp or a laser may be provided in the heat treatment reactor 50 of the heat treatment apparatus shown in FIG. 2, and a gas atmosphere of oxygen or ozone may be excited by ultraviolet light, thereby efficiently obtaining the active oxygen atmosphere.

Based on the manufacturing method for the capacitor structure in the semiconductor device according to the present invention, not only a nonvolatile memory cell (FERAM) using a ferroelectric thin film, but also a DRAM using a ferroelectric thin film can be constructed. In constructing a DRAM, only polarization of the ferroelectric thin film is utilized. That is, a difference ($P_{max}$−Pr) between maximum (saturated) polarization $P_{max}$ by an external electric field and residual polarization $P_r$ in the case of zero external electric field is in given proportional relationship with a supply voltage. This characteristic is utilized. A polarized condition of the ferroelectric thin film is always present between saturated polarization ($P_{max}$) and residual polarization ($P_r$), and is not inverted. Data is maintained by refresh.

What is claimed is:

1. A forming method for a ferroelectric thin film, wherein said ferroelectric thin film is subjected to heat treatment in an active oxygen atmosphere obtained by plasma excitation of oxygen.

2. A forming method for a ferroelectric thin film according to claim 1, wherein said active oxygen atmosphere is an oxygen atmosphere containing an oxidizing gas.

3. A forming method for a ferroelectric thin film according to claim 2, wherein said oxidizing gas is selected from ozone, $N_2O$, and $NO_2$.

4. A forming method for a ferroelectric thin film according to claim 1, wherein said active oxygen atmosphere is obtained by ultraviolet light excitation of ozone and/or oxygen.

5. A forming method for a ferroelectric thin film according to claim 1, wherein said ferroelectric thin film is formed of a Bi-based layer-structural perovskite type ferroelectric material.

6. A forming method for a ferroelectric thin film according to claim 5, wherein said ferroelectric thin film is formed of a material $Bi_2(Sr, Ba, Ca)(Ta, Nb)_2O_9$.

7. A forming method for a ferroelectric thin film according to claim 6, wherein said material is $Bi_2SrTa_2O_9$.

8. A manufacturing method for a capacitor structure in a semiconductor device, comprising the steps of:
   (a) forming a bottom electrode layer on a substrate;
   (b) forming a ferroelectric thin film on said bottom electrode layer, and next subjecting said ferroelectric thin film to heat treatment in an active oxygen atmosphere obtained by plasma excitation of oxygen; and
   (c) forming an upper electrode layer on said ferroelectric thin film.

9. A manufacturing method for a capacitor structure in a semiconductor device according to claim 8, wherein said active oxygen atmosphere is an oxygen atmosphere containing an oxidizing gas.

10. A manufacturing method for a capacitor structure in a semiconductor device according to claim 9, wherein said oxidizing gas is selected from ozone, $N_2O$, and $NO_2$.

11. A manufacturing method for a capacitor structure in a semiconductor device according to claim 8, wherein said active oxygen atmosphere is obtained by ultraviolet light excitation of ozone and/or oxygen.

12. A manufacturing method for a capacitor structure in a semiconductor device according to claim 8, wherein said ferroelectric thin film is formed of a Bi-based layer-structural perovskite type ferroelectric material.

13. A manufacturing method for a capacitor structure in a semiconductor device according to claim 12, wherein said ferroelectric thin film is formed of a material $Bi_2(Sr, Ba, Ca)(Ta, Nb)_2O_9$.

14. A manufacturing method for a capacitor structure in a semiconductor device according to claim 13, wherein said material is $Bi_2SrTa_2O_9$.

* * * * *